United States Patent [19]

Wong et al.

[11] Patent Number: 4,525,679
[45] Date of Patent: Jun. 25, 1985

[54] HIGH GAIN AMPLIFYING STAGE BY OUTPUT CONDUCTANCE CANCELLATION

[75] Inventors: Stephen L. Wong, Oakville; Clement A. T. Salama, Toronto, both of Canada

[73] Assignee: The University of Toronto Innovations Foundation, Toronto, Canada

[21] Appl. No.: 452,511

[22] Filed: Dec. 23, 1982

[51] Int. Cl.$^3$ .............. H03F 3/16; H03F 1/38; H03G 3/18
[52] U.S. Cl. .................. 330/277; 330/284; 330/112
[58] Field of Search .......... 330/70, 71, 291, 293, 330/93, 284, 277, 112

[56] References Cited

U.S. PATENT DOCUMENTS 3,286,189  11/1966  Mitchell et al. ............. 330/70

Primary Examiner—James B. Mullins
Assistant Examiner—G. Wan
Attorney, Agent, or Firm—Gerald J. Ferguson, Jr.; Joseph J. Baker

[57] ABSTRACT

A Metal-Oxide Semiconductor (MOS) high gain amplifying stage which overcomes the inherently low transconductance, gm, of MOS transistors is described. This is achieved by using a specially configured load transistor in combination with a driver transistor. The load transistor is provided, by means of positive feedback, with a current generator which is dependent on the output voltage of the stage and has an effective negative output conductance. The positive feedback is achieved by connecting an appropriate attenuation stage between the output and the input of the load transistor. By the cancellation of output conductances between the driver and load transistors, a near infinite voltage gain can be achieved despite resistive loading at the output of the amplifier. The MOS amplifying stage has application in amplifiers, comparators and oscillators. A complementary metal-oxide-semiconductor (CMOS) implementation has been realized but the principle is equally applicable to single channel (NMOS or PMOS) MOS technology.

6 Claims, 17 Drawing Figures

FIG 1a
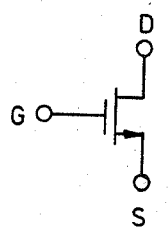
FIG.1b
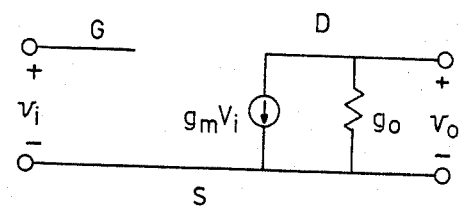
PRIOR ART
FIG. 2
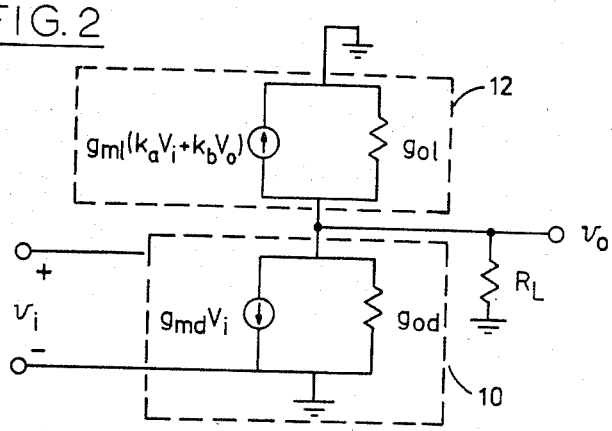
PRIOR ART
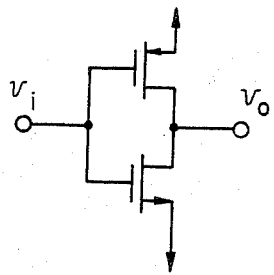
a) CMOS INVERTER
$k_a = 1$, $k_b = 0$
FIG. 3a
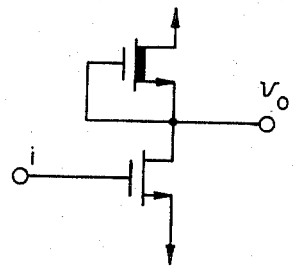
b) DEPLETION MODE
LOAD INVERTER
$k_a = k_b = 0$
FIG. 3b
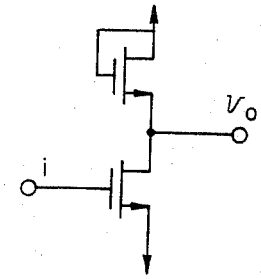
c) ENHANCEMENT MODE
LOAD INVERTER
$k_a = 0$  $k_b = 1$
FIG. 3c
PRIOR ART

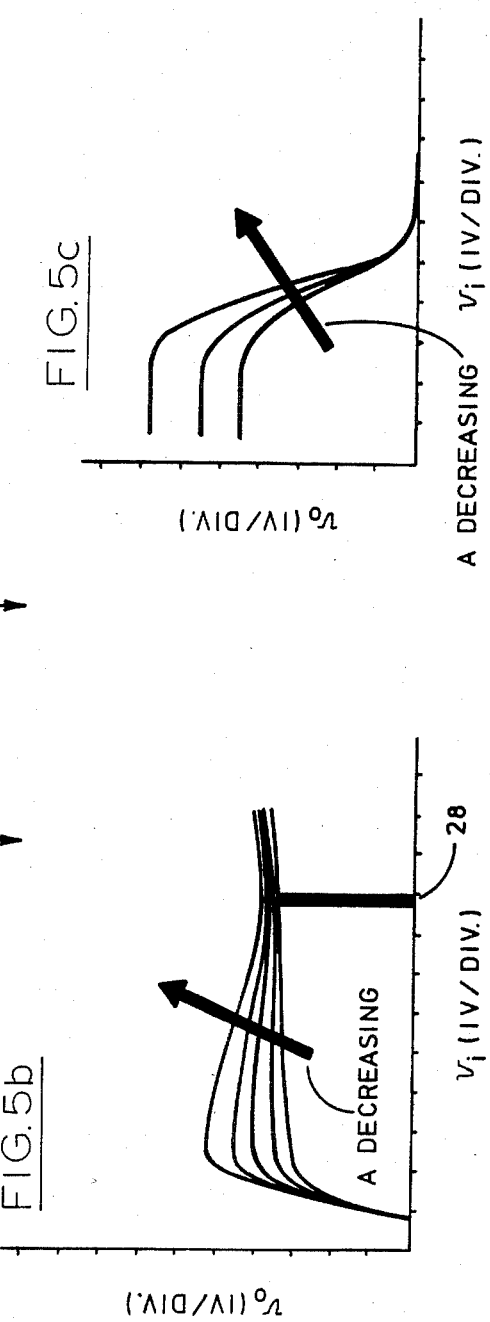

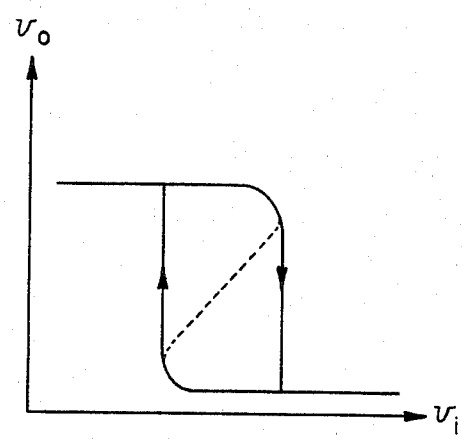
FIG. 7a
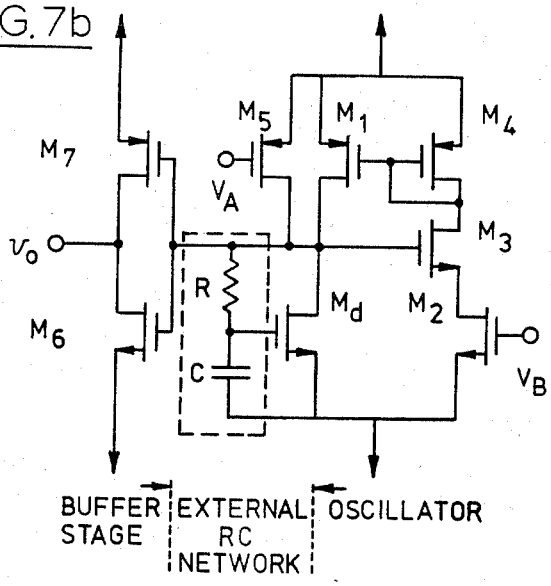
FIG. 7b
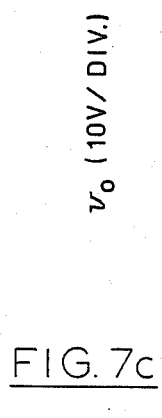
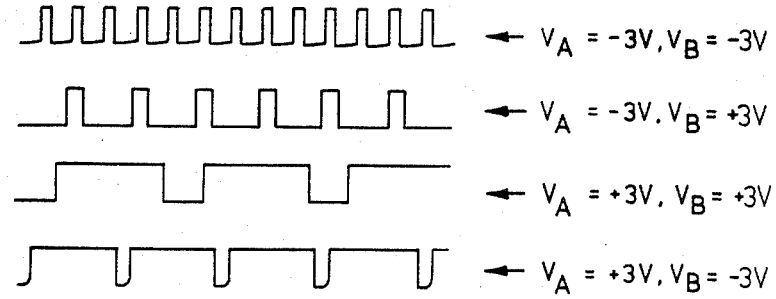
FIG. 7c

HIGH GAIN AMPLIFYING STAGE BY OUTPUT CONDUCTANCE CANCELLATION

FIELD OF THE INVENTION

The subject invention relates to high gain amplifying stages by output conductance cancellation techniques, and in particular, to amplifier stages utilising MOS (Metal-Oxide-Semiconductor) technology.

BACKGROUND OF THE INVENTION

In prior art MOS technology, the gain is severely limited by the inherently low transconductance, $g_m$, of the MOS transistor. The transconductance in a MOST (MOS transistor) is proportional to the ratio Z/L (the channel width (Z) to the channel length (L) of the device). Any attempt at increasing the gain by increasing the channel width (Z) of the device, or by cascading gain stages, results in large area consumption and increase in parasitic capacitances. Decreasing the channel length (L) of the MOS transistor to increase the transconductance has its limitations in the fact that it causes a degradation (increase) in output conductance $g_o$ of the device and thus causes a degradation of the voltage gain which is proportional to the ratio $g_m/g_o$. Therefore, attempts to overcome the low transconductance by modifying the Z/L ratio are not suitable.

A MOS transistor, as shown in FIG. 1a, may be represented by a small signal model which consists of a current generator $g_m v_i$, (where $v_i$ is the input gate voltage) and an output conductance $g_o$. (FIG. 1b).

An inverting gain stage comprising a driver transistor 10 and a load transistor 12 is shown in its most general form in FIG. 2. The driver transistor current generator ($g_{md} v_i$) is a function of the input signal $v_i$ only, while the current generator $[g_{ml}(k_a v_i + k_b v_o)]$ in the load transistor can be affected by both the input and/or the output signals. The small signal gain of the generalized inverter of FIG. 2 is given by $$\frac{v_o}{v_i} = -\frac{g_{md} + k_a g_{ml}}{g_{load} + g_{od} + 1/R_L}$$

where $g_{load}$ is the effective conductance of the load transistor and is given by $g_{load} = g_{ol} + k_b g_{ml}$ The constants $k_a$ and $k_b$ can have a value of one or zero depending on the type of inverter. Examples of which are shown in FIGS. 3(a), (b) and (c).

The principal disadvantage of the above-mentioned gain stage is that the maximum gain obtainable is low due to the low value of $g_m$ and the high value of $g_o$, particularly in the case of short channel MOS transistors. The maximum gain is given by $$\frac{v_o}{v_i} = -\frac{(g_{ml} + g_{md})}{g_{ol} + g_{od} + 1/R_L}$$

and is achieved using the CMOS stage shown in FIG. 3a.

An object of the present invention is to provide a higher gain amplifying stage than is achievable with the prior art.

A higher gain stage is accordingly provided which utilizes a negative conductance to reduce the total load conductance of the amplifying stage. The new arrangement allows positive feedback to be delivered to the input of the load, which causes $K_b$ 0 and effectively reduces $g_{load}$. $g_{load}$ can be reduced from positive to negative values by decreasing the attenuation of a positive feedback stage A. A negative $g_{load}$ can then be used to cancel the positive output conductance of the driver $g_{od}$, as well as the resistance of the load $R_L$. This can result in a near infinite voltage gain. In addition, the presence of positive feedback introduces phase lead which may have useful implications in amplifier design.

The high gain amplifier of the subject application is particularly adaptable to implementation in amplifiers, comparators and oscillators. An important advantage of this invention is that the high gain is provided by a single stage only; this allows easier composition of the amplifier and also frees the input and the output stages from the requirements of providing gain. Those stages can then be designed to optimise other input/output specifications such as input offset, dynamic range and current driving capability.

BRIEF DESCRIPTION OF THE DRAWINGS

The preferred embodiment and best mode contemplated for implementing the subject invention will now be described in detail with reference to the accompanying drawings of which:

FIGS. 1a and 1b are models for a single MOS transistor according to the prior art;

FIG. 2 is the equivalent circuit of an inverting stage using the small signal model of FIG. 1b;

FIGS. 3a, 3b and 3c are three examples of MOS inverters according to the prior art with the type of inverter being selected by the value of the constants $k_a$ and $k_b$;

FIG. 4b demonstrates a CMOS implementation of the amplifying stage of FIG. 4a;

FIG. 5a shows a practical circuit configuration of the amplifying stage according to the present invention realised in a CMOS implementation;

FIG. 5b is a graph demonstrating the adjustable (from positive to negative slopes) load lines of the amplifier shown in FIG. 5a;

FIG. 5c shows the corresponding programmable transfer curves obtained by varying the amount of positive feedback with $R_L = 1k\Omega$;

FIG. 7a shows the transfer curves obtained when the gain is adjusted to be larger than that required for total conductance cancellation;

FIG. 7b is a circuit diagram of a voltage control oscillator using the principles according to the present invention with the gain adjusted to be larger than that required for total conductance cancellation.

FIG. 7c is a graph of output pulses resulting from the circuit of FIG. 7b when the voltages $V_a$ and $V_b$ are controlled.

DESCRIPTION OF PREFERRED EMBODIMENT

Figure 4B:
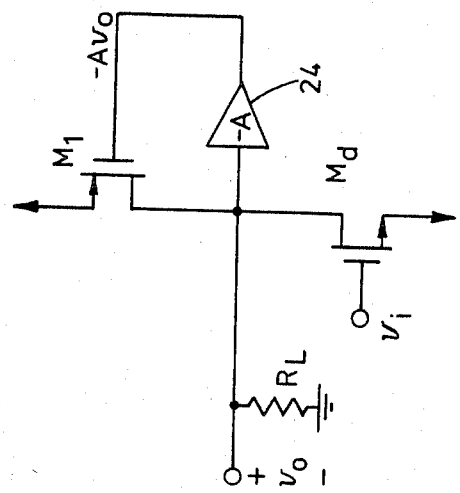
Figure 4A:
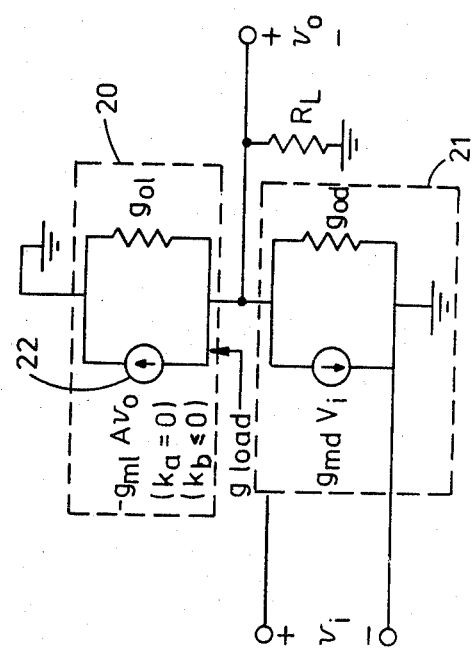
FIG. 4a demonstrates the basic configuration of the improved high gain amplifying stage in small signal equivalent circuit form according to the present invention.

Referring now to FIG. 4a of the drawings, the principle of the invention is demonstrated. The load transistor 20 of the gain stage has been provided by means of positive feedback, with a $v_o$ dependent current generator 22 having an effective negative transconductance value $-g_{m1}A$, where the attenuation A is less than 1, and is provided by the stage 24 (see FIG. 4b). The input signal $v_i$ is delivered to the free input of the driver transistor 21. The effective output conductance of the load transistor 20 in this case can be shown to be $$g_{load} = g_{o1} - g_{m1}A.$$

where $g_{o1}$ is the actual output conductance of the load transistor 20, and $g_{m1}$ is the actual transconductance of the load transistor 20.

A constant attenuator, is not desirable, since $g_{load}$ would become a direct function of $g_{m1}$, whose value depends on the instantaneous value of $-Av_o$. Since $g_{load}$ varies with the level of $v_o$, exact conductance cancellation with $g_{od}$ can only be attained at a limited output range about the quiescent point.

Referring now to FIG. 5a, the above principle is demonstrated by a novel gain stage which is realized using standard CMOS technology. An optimal A stage 26 was designed to offer improved output swing and maintain high gain over a wider range of output voltages. The attenuation of M2, M3 and M4 (which form the attenuator 26) is not constant and is approximately given by $$A = \frac{g_{o2} + 1/R_2}{g_{m4}}$$

where $g_{o2}$ and $g_{m4}$ are the output conductance and transconductance of transistors M2 and M4 respectively. Since $g_{m4}$ tracks $g_{m1}$, the dependence of $g_{load}$ on $g_{m1}$ can be cancelled. The resulting $g_{load}$ is nearly independent of the operating point and is given by $$g_{load} = g_{o1} - g_{o2} - 1/R_2$$

Therefore, $g_o$ cancellation can be maintained over a wide range of output voltages.

The final voltage gain is given by $$\frac{v_o}{v_i} = \frac{-g_{md}}{g_{od} + g_{o1} - g_{o2} - 1/R_2 + 1/R_L}$$

where maximum gain is achieved by selecting $$R_2 = \frac{1}{g_{od} + g_{o1} - g_{o2} + 1/R_L}$$

The Zener diode $Z_1$ and limiting resistor $R_1$ are required to prevent hard current cutoff in transistor M4 and transistor M2, resulting in the characteristic shown by line 28 in FIG. 5b. This occurs when $v_o$ falls below $[V_B - V_{T2}] + V_{T3}$, where $V_B$ is the bias voltage and $V_{T2}$ and $V_{T3}$ are the threshold voltages of transistors M2 and M3 respectively (in other words, without $Z_1$, if the gate to source voltage of transistor M3 is less than the threshold voltage $V_{T3}$ of M3, the whole stage is driven into hard cut-off).

The adjustable load lines generated by this scheme are shown in FIG. 5(b), the instantaneous slope gives the value for $g_{load}$. FIG. 5(c) shows the corresponding programmable transfer curves obtained by varying the attenuation provided by A with $R_L = 1K\Omega$. As the values of A decreased, the transfer curves exhibited higher voltage gain, as well as increased voltage swing.

Figure 6A:
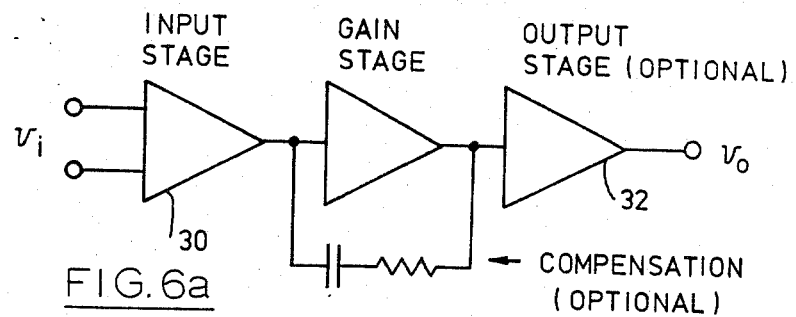
FIG. 6a is a block diagram representing an operational amplifier or comparator using a gain stage realised in accordance with the present invention.

The embodiment described may be used as an operational amplifier by simply adding an input stage 30 and an output stage 32 as shown in FIG. 6a. The main advantage of this configuration is that the high gain is provided by a single stage.

Figure 6B:
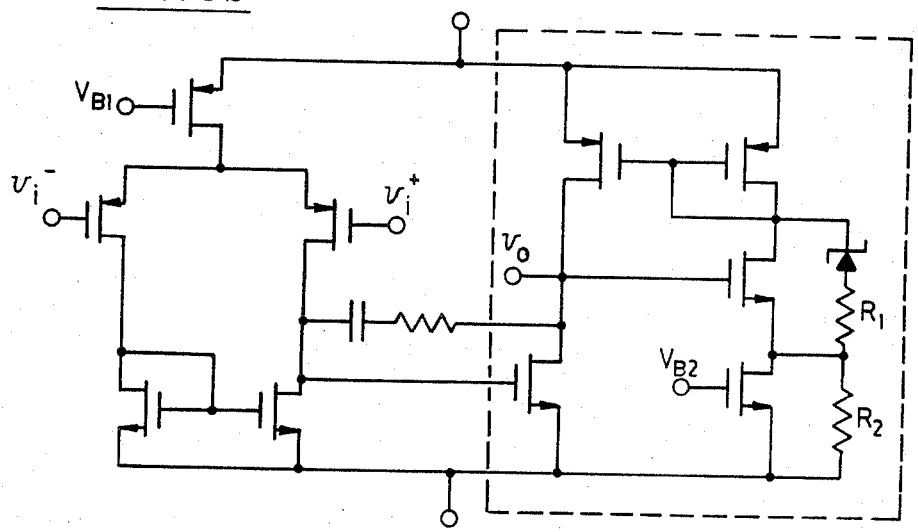
FIG. 6b shows a practical realization of the operational amplifier of FIG. 6a implemented in CMOS technology.
Figure 6C:
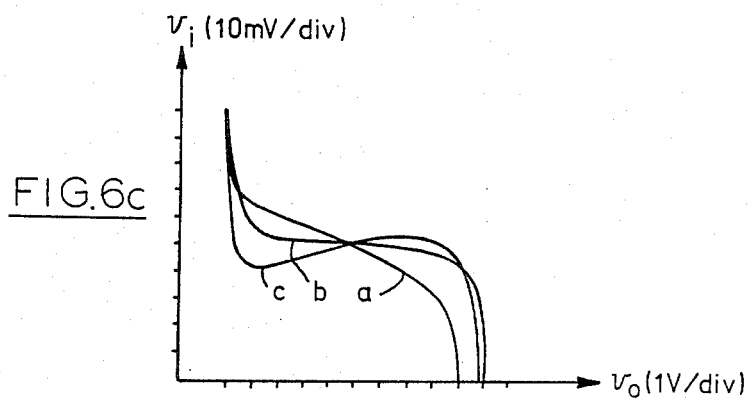
FIG. 6c shows transfer curves obtained with the operational amplifier of FIG. 6 with varying amounts of positive feedback applied to the high gain stage.

As an implementation of FIG. 6a, an experimental operational amplifier, designed using short channel MOST's, was fabricated and shown in FIG. 6b. Excellent DC transfer characteristics was observed and illustrated in FIG. 6c. In FIG. 6c when no positive feedback is used, the amplifier has a voltage gain of less than $-250$ (curve a). The voltage gain is the slope Vo/Vi of the curve in FIG. 6c. As $R_2$ is decreased, improvements in both voltage gain and output swing are observed. Maximum gain was observed at $R_2 \cong 23k\Omega$ (curve b). In the range $-3V \leq v_o \leq 0$, the effective voltage gain is better than 10,000. The gain stage therefore improved the gain of the operational amplifier by more than 40 times. Higher gain would still be possible with the optimum choice of (Z/L) aspect ratios for the transistor, since this can increase the infinite gain range of the transfer curve. When $R_2$ is reduced further, a hysterisis effect is observed (curve c).

When "A" is adjusted to be larger than required for total conductance cancellation, the transfer curves obtained exhibit a hysterisis effect as shown in FIG. 7a. Such a characteristic is ideal for the implementation of oscillators. A CMOS voltage controlled oscillator circuit is shown in FIG. 7b. The gain stage differs slightly from the previous case. The Zener diode $Z_1$, and resistors $R_1$, $R_2$, have been eliminated. The voltage $V_B$ applied to the gate of $M_2$ can be used to control the separation between the triggering points and control the frequency of oscillation. By adding transistor $M_5$, the voltage $V_A$ can be used to adjust the offset of the trigger which in turn governs the duty cycle of the output pulse. The resulting output pulses shown in FIG. 7c illustrate the different frequencies and duty cycles which can be obtained by controlling $V_A$ and $V_B$.

It will be readily apparent that various changes may be made to the description of the embodiments and related drawings without affecting the scope of the invention. For example, the principle of the invention could readily be implemented in single channel Metal-Oxide Semiconductor (NMOS or PMOS) technology. The same can be said for implementations using an inverted CMOS configuration, where the roles between the n-channel and p-channel transistors are reversed. In addition, it will be readily appreciated substrates of the MOS devices, may be connected to sources or to the power supplies without significantly affecting the principle of the invention.

We claim:

1. A metal-oxide semiconductor (MOS) gain stage fabricated on an integrated circuit and having a load transistor, a driver transistor, a gain stage output taken between the load transistor and the driver transistor, and a variable attenuator connected between the output of the gain stage and an input of the load transistor, said variable attenuator including other MOS transistors, coupled together such that the output conductance of the load transistor is substantially independent of the operating point of the gain stage providing, by positive feedback, a current generator dependent on the output voltage, the current generator having an effective negative output conductance which substantially cancels the total load conductance of the gain stage over a wide range of output voltages, and said output conductance cancellation constituting means effective such that the voltage gain of the stage is substantially increased.

2. A MOS gain stage as claimed in claim 1 wherein the variable attenuator is adjustable to provide exact cancellation of the negative effective output conductance of the load transistor with the driver transistor's output conductance and the load resistor is achievable to provide near infinite voltage gain.

3. An MOS gain stage as claimed in claim 1 wherein said gain stage has coupled thereto an input amplifier and an output amplifier, said input amplifier, gain stage and output stage forming an operational amplifier.

4. A complementary metal oxide semiconductor (CMOS) gain stage fabricated on an integrated circuit and comprising a load MOS transistor, a driver MOS transistor, the drain of the driver transistor being connected to the drain of the load transistor, a gain stage output taken between the driver transistor and the load transistor a variable attenuator having an input and an output, the variable attenuator including MOS transistors, the attenuator input being connected to output of the gain stage and to the drain of the load transistor and the drain of the driver transistor, the output of the attenuator being connected to the input of the load transistor, the arrangement being such that the load transistor is provided, by positive feedback from the variable attenuator, with a current generator dependent on the output voltage, the current generator having an effect of negative output conductance to substantially cancel the total load conductance of the gain stage over a wide range of output voltages, and said output conductance cancellation constituting means effective such that said output conductance cancellation is substantially increased.

5. A CMOS gain stage as claimed in claim 4 wherein the variable attenuator includes switching means in parallel therewith, said switching means conducting current when said output voltage is less than the theshold voltage of said attenuator.

6. A CMOS gain stage as claimed in claim claim 4 or 5, said CMOS gain stage having an input amplifier stage and an output stage thereby forming an operational amplifier.

* * * * *